(12) United States Patent
Zakgeym et al.

(10) Patent No.: US 7,491,978 B2
(45) Date of Patent: Feb. 17, 2009

(54) LIGHT EMITTING DIODE PACKAGE

(75) Inventors: Alexander L'Vovich Zakgeym, St.-Petersburg (RU); Seog Moon Choi, Seoul (KR); Sung Jun Lee, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 188 days.

(21) Appl. No.: 11/492,754

(22) Filed: Jul. 26, 2006

(65) Prior Publication Data
US 2007/0023776 A1 Feb. 1, 2007

(30) Foreign Application Priority Data
Jul. 26, 2005 (RU) ............... 2005123795

(51) Int. Cl.
*H01L 33/00* (2006.01)
(52) U.S. Cl. .................. 257/98; 257/E33.056
(58) Field of Classification Search .......... 257/79, 257/98, 99, E33.055, E33.056, E33.057, 257/E33.058, E33.059
See application file for complete search history.

(56) References Cited

U.S. PATENT DOCUMENTS 6,838,689 B1 * 1/2005 Deng et al. ............ 250/559.3
6,881,980 B1 * 4/2005 Ting ........................ 257/81
2005/0087866 A1 * 4/2005 Shei et al. .................. 257/738

* cited by examiner

*Primary Examiner*—Evan Pert
*Assistant Examiner*—Kevin Quinto
(74) *Attorney, Agent, or Firm*—McDermott Will & Emery LLP

(57) ABSTRACT

A light emitting diode package is provided. The light emitting diode package comprises a submount substrate which includes a mounting region having side walls inclined upwardly, first and second cavities formed around the mounting region, and first and second grooves extending between the mounting region and the first and second cavities on an upper surface of the submount. The package further comprises first and second bump pads formed on a bottom surface of the mounting surface, first and second bonding pads formed on a bottom surface of the first and second cavities, respectively, first and second conductive lines formed along a bottom surface of the first and second grooves for connecting the first and second bump pads to the first and second bonding pads, respectively, and a light emitting diode mounted on the mounting region so as to be connected to the first and second bump pads.

7 Claims, 4 Drawing Sheets

(a)

(b)

LIGHT EMITTING DIODE PACKAGE

CLAIM OF PRIORITY

This application claims the benefit of Russian Patent Application No. 2005123795 filed on Jul. 26, 2005 in the Russian Patent Office, the disclosure of which is incorporated herein by reference.

BACKGROUND OF THE INVENTION

1. Field of the Invention

The present invention relates to a light emitting diode package, and, more particularly, to a high power light emitting diode package, which overcomes a problem of defects in a metal wiring structure caused by a step of a submount substrate.

2. Description of the Related Art

Generally, light emitting packages must satisfy two requirements, namely, high light emitting efficiency and excellent heat dissipation. These characteristics are very important, in particular, for high power light emitting diode packages mainly used in illuminating apparatuses.

In view of the light emitting efficiency and heat dissipation, a conventional light emitting diode employs a package which comprises a semiconductor substrate such as silicon having a cavity formed therein, as a submount substrate. One example of the light emitting diode is illustrated in FIGS. 1a and 1b.

As shown in FIG. 1a, a conventional light emitting diode package 10 comprises a silicon submount substrate 11 having a mounting region formed thereon. The diode package 10 further comprises an insulating layer 12 such as a $SiO_2$ layer formed on the submount substrate 11, and a metal wiring structure formed on the insulating layer 12.

As shown in FIG. 1b, the metal wiring structure comprises first and second bump pads 13a and 13b connected to respective electrodes (not shown) of a light emitting diode 18, first and second bonding pads 15a and 15b connected to external circuit, and first and second conductive lines 14a and 14b connecting the first and second bump pads 13a and 13b to the first and second bonding pads 15a and 15b, respectively.

Although silicon mainly used for the submount substrate 11 has a low thermal conductivity about a third of that of metal, it can be machined to a narrow thickness through a MEMS process, thereby ensuring a lower thermal resistance. Moreover, the mounting region has a structure wherein, after the cavity C is formed on the submount substrate 11 by typical semiconductor processing, metal reflecting plates 16 are formed at opposite sides of the cavity C. The package 10 having the metal reflecting plates 16 ensures high light emitting efficiency.

However, the conventional light emitting diode package 10 suffers defects in the wiring structure due to formation of the cavity C provided as the mounting region. That is, since the first and second conductive lines 14a and 14b are formed along inclined side walls of the cavity C, respectively, there is a high possibility of disconnection at portions (regions indicated by I and II) where the first and second bump pads 13a and 13b are connected to the first and second bonding pads 15a and 15b, respectively.

As such, the submount substrate having the cavity formed in the mounting region provides advantages in view of easy formation of the reflecting plates for enhancing the light emitting efficiency, and effective thermal dissipation by a small thickness of the portion of the substrate where the light emitting diode is mounted. However, since steps are formed on the submount substrate due to formation of the cavity, and cause disconnection, there is a limitation in manufacturing of a highly reliable light emitting diode package with such a submount substrate.

SUMMARY OF THE INVENTION

The present invention has been made in view of the above problems, and it is an object of the present invention to provide a light emitting diode package, which lowers a height of steps or removes the steps from a region to be formed with a wiring structure, thereby preventing undesired disconnection in the wiring structure.

In accordance with one aspect of the present invention, the above and other objects can be accomplished by the provision of a light emitting diode package, comprising: a submount substrate including a mounting region having side walls inclined upwardly, first and second cavities formed around the mounting region, and first and second grooves extending between the mounting region and the first and second cavities on an upper surface of the submount; first and second bump pads formed on a bottom surface of the mounting surface; first and second bonding pads formed on a bottom surface of the first and second cavities, respectively; first and second conductive lines formed along a bottom surface of the first and second grooves for connecting the first and second bump pads to the first and second bonding pads, respectively; and a light emitting diode mounted on the mounting region so as to be connected to the first and second bump pads.

The light emitting diode package may further comprise reflecting plates formed on the side walls. The submount substrate may be a silicon substrate having an insulating layer formed on an upper surface thereof. In this case, the insulating layer may be a $SiO_2$ layer formed by a thermal oxidation process.

The first and second cavities, the mounting regions, and the first and second grooves may be formed to have substantially coplanar bottom surfaces. As a result, the first and second conductive lines can be formed on the substantially coplanar bottom surface.

The mounting region may be located at a center of the upper surface of the submount substrate, and the first and second cavities may be located at opposite sides of the mounting region. The first and second cavities, the first and second grooves, and the mounting region may be integrated to a single cavity region having a predetermined width.

At least one of the first and second cavities may be opened at one side through a side of the submount substrate. In this manner, wire bonding between the bonding pads formed on the first and second cavities and the external circuit can be easily performed.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Preferred embodiments of the present invention will now be described in detail with reference to the accompanying drawings.

Figure 2:
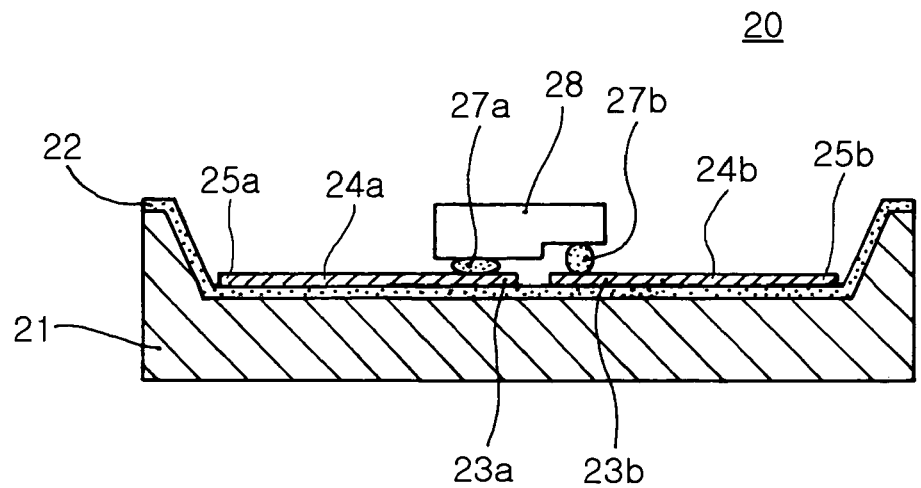
FIGS. 2a and 2b are a side sectional view and a plan view illustrating a light emitting diode package in accordance with one embodiment of the present invention, respectively.
Figure 2:
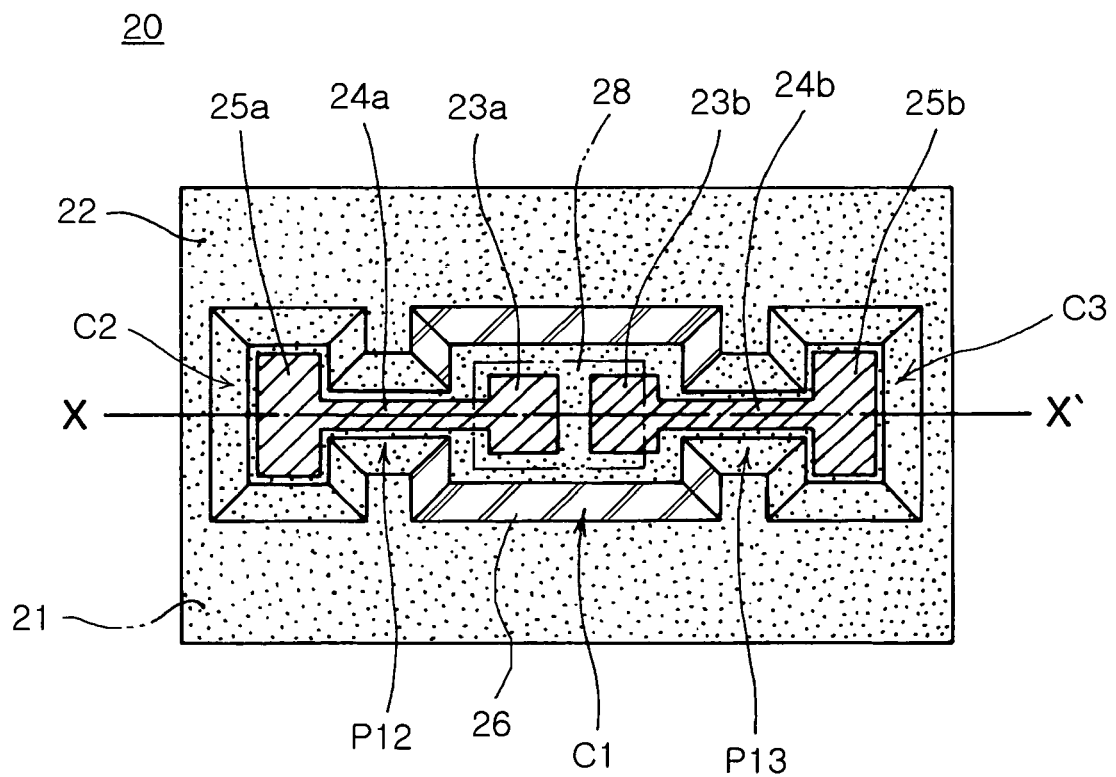

FIGS. 2a and 2b are a side sectional view and a plan view illustrating a light emitting diode package 20 in accordance with one embodiment of the invention, respectively. FIG. 2a shows a cross section taken along line X-X' of the light emitting diode package 20 shown in FIG. 2b.

The light emitting diode package 20 of FIG. 2b comprises a submount substrate 21 having a main cavity C1 formed thereon. The submount substrate 21 may be a silicon substrate, which can be easily processed by MEMS. The main cavity C is provided as a mounting region, and has side walls inclined upwards. The inclined side walls of the mounting region are formed with reflecting plates 26 for enhancing light emitting efficiency of the light emitting diode 28, as shown in FIG. 2b. The reflecting plates 28 are composed of a highly reflective metal, such as Al or Ag.

As shown in FIGS. 2a and 2b, first and second assistant cavities C2 and C3 are formed around the mounting region. The first and second assistant cavities C2 and C3 may be formed at opposite ends of the submount substrate 21 such that the first and second assistant cavities C2 and C3 are located at opposite sides of the mounting region, as in the present embodiment. The mounting region and the first and second assistant cavities C2 and C3 are connected via first and second grooves P12 and P13. Preferably, the first and second assistant cavities C2 and C3, and the main cavity C1 provided as the mounting region may be formed to have the same depth as that of the grooves P12 and P13 so as to have a flat bottom surface.

As shown in FIG. 2b, first and second bump pads 23a and 23b are formed on the bottom surface of the mounting region, and the light emitting diode 28 are located on the first and second bump pads 23a and 23b such that respective electrodes (not shown) of the diode 28 are connected to the first and second bump pads 23a and 23b via solder bumps 27a and 27b. First and second bonding pads 25a and 25b for connection to the external circuit are formed on the bottom surface of the first and second assistant cavities C2 and C3.

Figure 1:
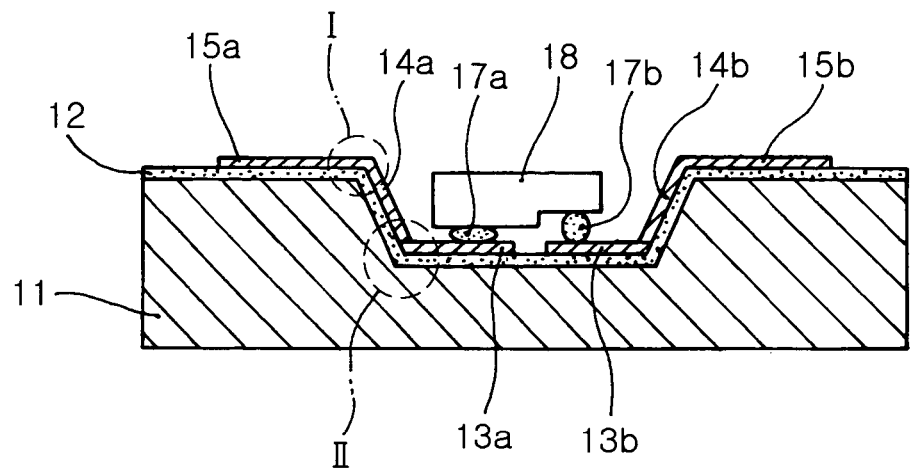
FIGS. 1a and 1b are a side sectional view and a plan view illustrating a conventional light emitting diode package, respectively.
Figure 1:
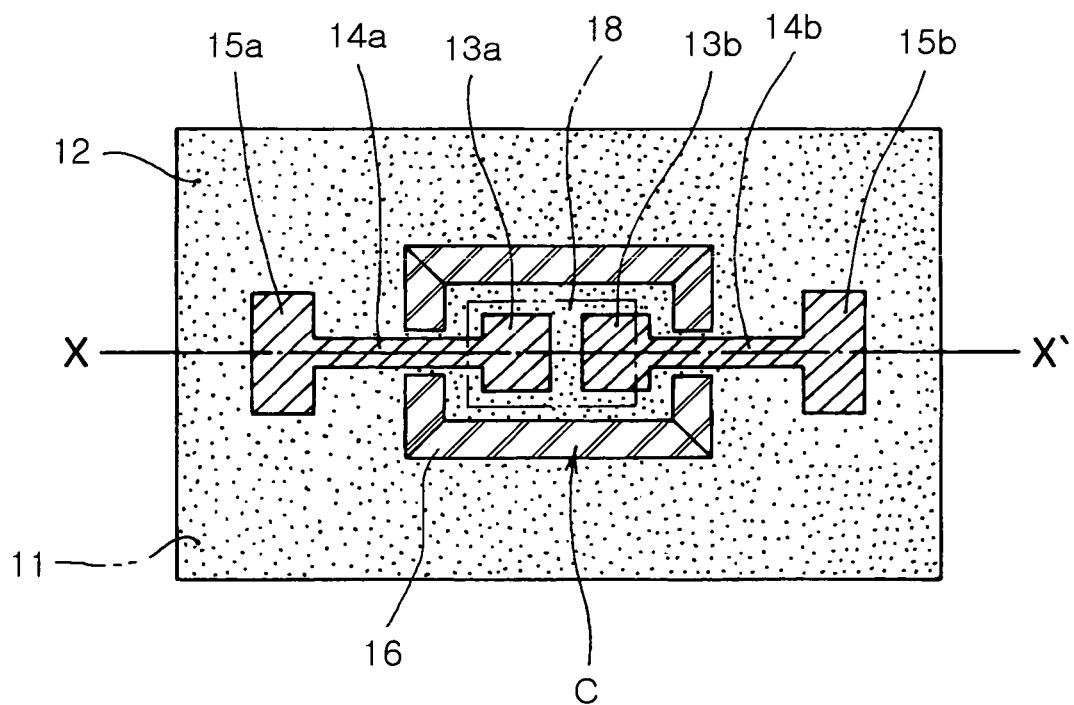

The first and second bump pads 23a and 23b are connected to the bonding pads 25a and 25b via first and second conductive lines 24a and 24b formed on the bottom surface of the grooves P12 and P13. Unlike the conventional light emitting diode package (see FIG. 1a), the first and second assistant cavities C2 and C3, and the grooves P12 and P13 are additionally formed on a region where the bonding pads 25a and 25b, and the first and second conductive lines 24a and 24b are formed, thereby lowering the height of the steps where the wiring structure will be formed. In particular, as shown in FIG. 2b, the assistant cavities C2 and C3, and the grooves P12 and P13 are formed to have substantially the same depth as that of the main cavity C1 in the mounting region, thereby forming the first and second conductive lines 24a and 24b on the substantially flat surface. As a result, disconnection of the wiring structure (in particular, conductive lines) caused by the steps can be remarkably prevented.

As such, the present invention is characterized in that the steps are lowered in height or removed altogether from the wiring region by an additional etching process to the region where the bonding pads and the conductive lines will be formed, thereby providing a highly reliably light emitting diode package.

Figure 3:
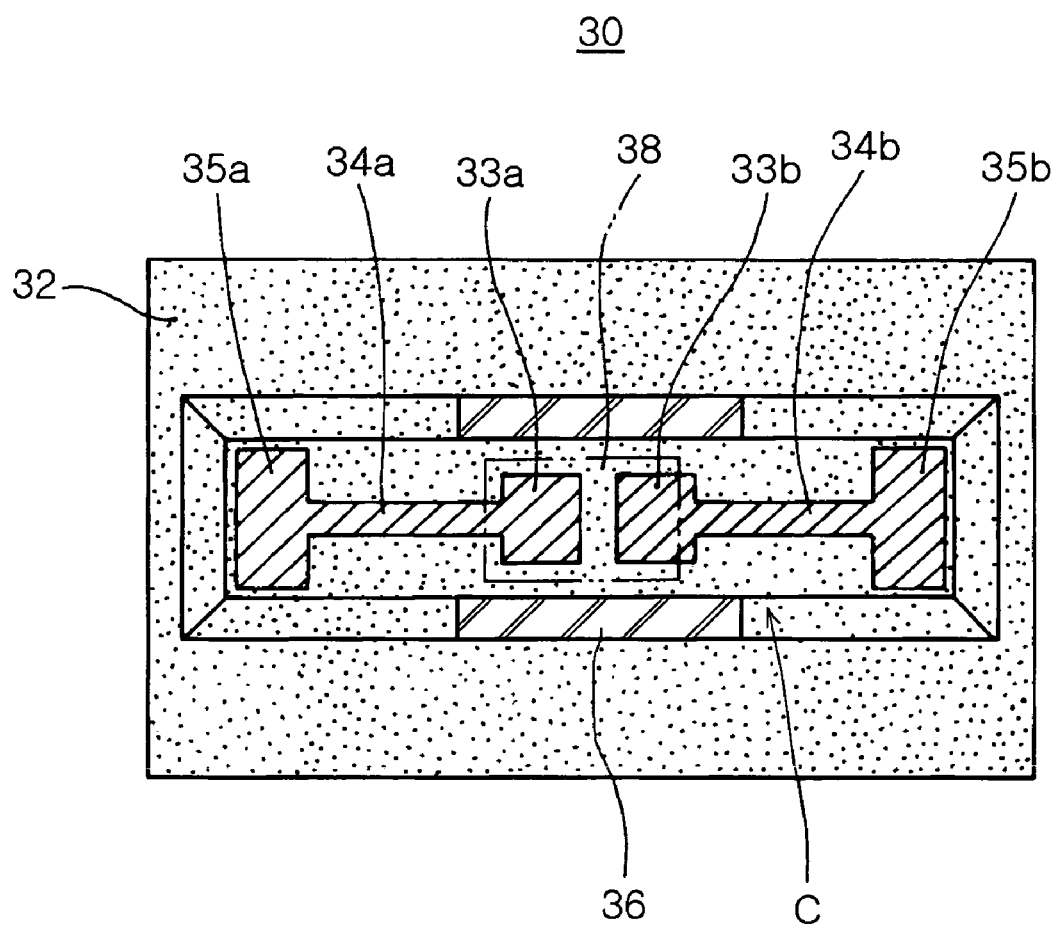
FIG. 3 is a plan view illustrating a light emitting diode package in accordance with another embodiment of the present invention.

Unlike the structure shown in FIG. 2b, the light emitting diode package can be realized to the structure, as shown in FIG. 3, wherein a single cavity region including a wiring region is formed.

A light emitting diode package 30 shown in FIG. 3 may comprise a silicon submount substrate (not shown) having an insulating layer 32 similar to that of FIG. 2b formed thereon. A cavity C is formed as a single component and to a rectangular shape having an identical width on the submount substrate. Unlike the conventional package, the cavity C of the present embodiment is formed to comprise a region where bonding pads and conductive lines will be formed, as well as a region where bump pads will be formed. It can be understood that the cavity of the present embodiment is formed by integrating the first and second cavities, the first and second grooves, and the mounting region shown in FIG. 2b. In this embodiment, since first and second bump pads 33a and 33b, first and second bonding pads 35a and 35b, and conductive lines 34a and 34b are also formed on a substantially coplanar bottom surface, the disconnection of the wiring structure caused by the steps can be solved.

According to the present embodiment, reflecting layers 36 on opposite side walls of the cavity C can be formed on opposite side walls adjacent to a light emitting diode 38. Thus, although the package of the embodiment is relatively low in enhancement of light emitting efficiency, it can be manufactured via a more simple process.

Figure 4:
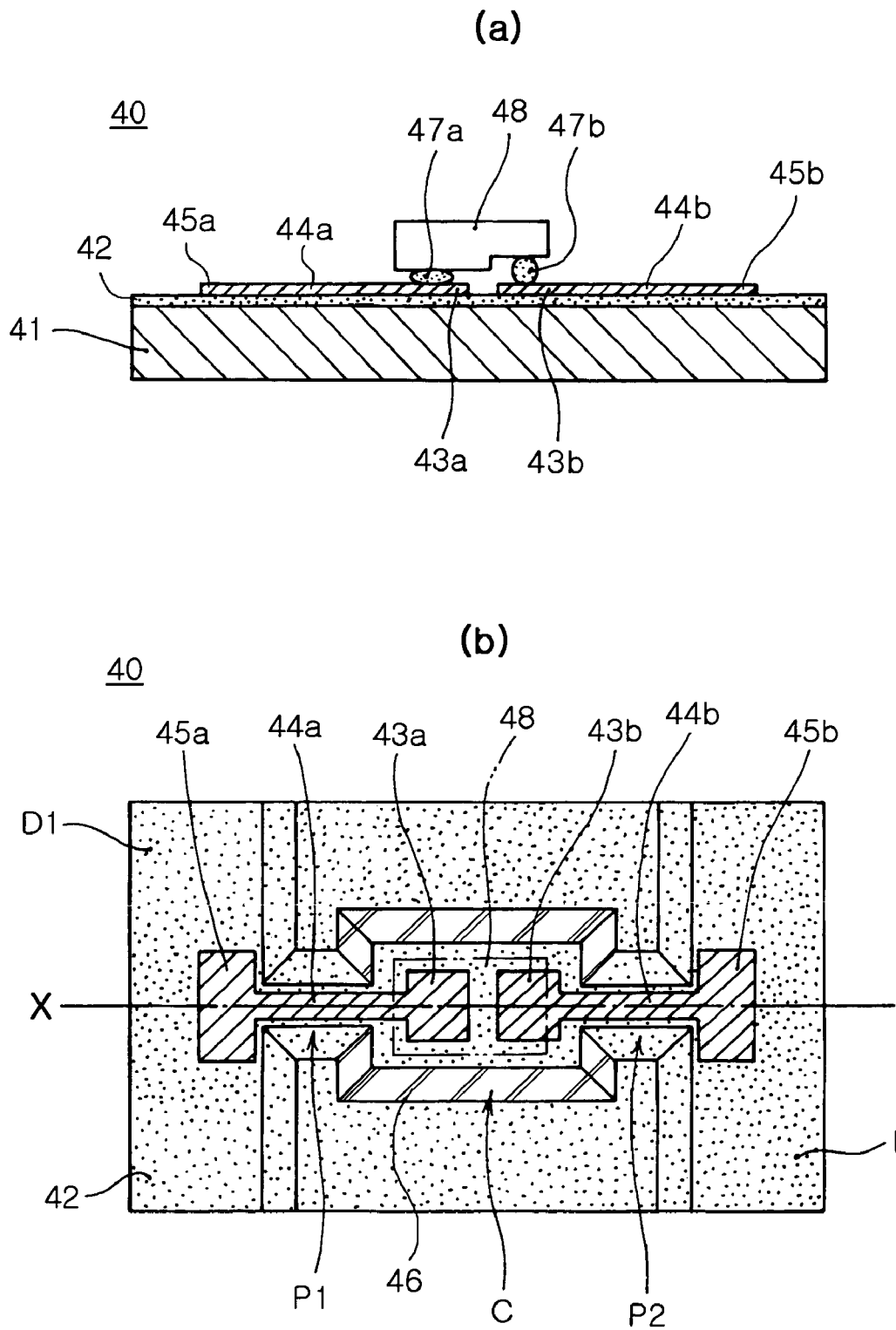
FIGS. 4a and 4b are a side sectional view and a plan view illustrating a light emitting diode package in accordance with yet another embodiment of the present invention, respectively.

FIGS. 4a and 4b are a side sectional view and a plan view illustrating a light emitting diode package 40 in accordance with yet another embodiment of the invention, respectively.

Referring to FIGS. 4a and 4b, the light emitting diode package 40 according to the present embodiment comprises a submount substrate 41 having a main cavity C formed thereon. The cavity C is provided as a mounting region, and has side walls inclined upwards. The inclined side walls of the mounting region are formed with reflecting plates 46 for enhancing light emitting efficiency of the light emitting diode 28.

As shown in FIGS. 4a and 4b, first and second bump pads 43a and 43b are formed on a bottom surface of the mounting region, and the light emitting diode 48 is located on the first and second bump pads 43a and 43b such that respective electrodes (not shown) of the diode 48 are connected to the first and second bump pads 43a and 43b via solder bumps 47a and 47b. First and second bonding pads 45a and 45b are formed on a bottom surface of the first and second cavities D1 and D2, and connected to an external circuit. As with the structure shown in FIG. 2b, the first and second cavities D1 and D2 are located at opposite sides of the main cavity C in the mounting region. The first and second cavities D1 and D2 are connected to the main cavity C via the first and second grooves P1 and P2, and are opened where the first and second cavities D1 and D2 contact lateral edges of the substrate 41. Although the cavities D1 and D2 of present embodiment are described as being opened where the first and second cavities D1 and D2 contact the lateral edges of the substrate, the cavities may be selectively opened at only one edge according to layout of bonding wire.

The present embodiment provides advantages in that an area for the reflecting layers 46 can be similar to that shown in FIG. 2b while allowing an easy wire bonding process.

In the present embodiment, the first and second cavities D1 and D2, and the grooves P12 and P13 are formed to have the substantially same depth as that of the main cavity C1 in the mounting region, thereby allowing the first and second conductive lines 44a and 44b to be formed on the substantially flat surface as shown in FIG. 4a. As a result, disconnection in the wiring structure (in particular, conductive lines) caused by the steps can be remarkably prevented.

As apparent from the description, according to the present invention, the steps are lowered in height or removed altogether from the wiring region by an additional etching process to the region where the bonding pads and the conductive lines will be formed together with a cavity provided as a mounting region and having side walls for forming reflecting layers, thereby providing a highly reliably light emitting diode package which can prevent undesired disconnection of the wiring.

It should be understood that the embodiments and the accompanying drawings have been described for illustrative purposes and the present invention is limited only by the following claims. Further, those skilled in the art will appreciate that various modifications, additions and substitutions are allowed without departing from the scope and spirit of the invention according to the accompanying claims.

What is claimed is:

1. A light emitting diode package, comprising:
   a submount substrate including a main cavity defined as a mounting region and having side walls inclined upwardly, first and second assistant cavities formed around the main cavity, and first and second grooves extending between the main cavity and the first and second assistant cavities on an upper surface of the submount;
   first and second bump pads formed on a bottom surface of the main cavity;
   first and second bonding pads formed on a bottom surface of the first and second assistant cavities, respectively;
   first and second conductive lines formed along a bottom surface of the first and second grooves for connecting the first and second bump pads to the first and second bonding pads, respectively; and
   a light emitting diode mounted on the main cavity so as to be connected to the first and second bump pads.

2. The light emitting diode package according to claim 1, further comprising:
   reflecting plates formed on the side walls of the main cavity.

3. The light emitting diode package according to claim 1, wherein the submount substrate is a silicon substrate having an insulating layer formed on an upper surface thereof.

4. The light emitting diode package according to claim 1, wherein the first and second assistant cavities, the main cavity, and the first and second grooves have substantially coplanar bottom surfaces, and the first and second conductive lines are formed on the coplanar bottom surfaces.

5. The light emitting diode package according to claim 1, wherein the main cavity is located at a center of the upper surface of the submount substrate, and the first and second assistant cavities are located at opposite sides of the main cavity, respectively.

6. The light emitting diode package according to claim 5, wherein the first and second assistant cavities, the first and second grooves, and the main cavity are integrated to a single cavity region having a predetermined width.

7. The light emitting diode package according to claim 1, wherein at least one of the first and second assistant cavities is opened at one side through a side of the submount substrate.

* * * * *